United States Patent [19]
Salfelder et al.

[11] Patent Number: 5,636,098
[45] Date of Patent: Jun. 3, 1997

[54] BARRIER SEAL FOR ELECTROSTATIC CHUCK

[75] Inventors: Joseph Salfelder, Williston, Vt.;
Dennis Grimard, Ann Arbor, Mich.;
John F. Cameron, Los Altos, Calif.;
Chandra Deshpandey, Fremont, Calif.;
Robert Ryan, Sunnyvale, Calif.;
Michael G. Chafin, Underhill, Vt.

[73] Assignee: Applied Materials, Inc., Santa Clara, Calif.

[21] Appl. No.: 439,010

[22] Filed: May 11, 1995

Related U.S. Application Data

[63] Continuation-in-part of Ser. No. 369,237, Jan. 6, 1994.
[51] Int. Cl.$^6$ ..................................................... H02N 13/00
[52] U.S. Cl. ........................................................... 361/234
[58] Field of Search ..................................... 361/230, 234; 269/8, 903; 279/128

[56] References Cited

U.S. PATENT DOCUMENTS

| | | | |
|---|---|---|---|
| 5,452,177 | 9/1995 | Frutiger | 361/234 |
| 5,484,485 | 1/1996 | Chapman | 118/723 R |
| 5,486,975 | 1/1996 | Shamouilian et al. | 361/234 |

*Primary Examiner*—Fritz Fleming
*Attorney, Agent, or Firm*—Ashok K. Janah; Peter J. Sgarbossa

[57] ABSTRACT

An erosion resistant electrostatic chuck 20 for holding a substrate 45 having a peripheral edge 50, in an erosive environment, comprises an electrostatic member 25 including (i) an electrode 30, and (ii) an insulator 35 covering the electrode. A barrier 55 is circumferentially disposed about the electrostatic member 25. The barrier 55 comprises a first contact surface 60 capable of being pressed against the peripheral edge 50 of the substrate 45 to form a seal around the substrate 45 to reduce exposure of the electrostatic member 25 of the chuck 20 to the erosive environment.

36 Claims, 6 Drawing Sheets ial cross-section schematic

BARRIER SEAL FOR ELECTROSTATIC CHUCK

CROSS-REFERENCE

This application is a continuation-in-part of U.S. Pat. No. 08/369,237, entitled "Corrosion Resistant Electrostatic Chuck with Improved Cooling System," filed on Jan. 6, 1994, which is incorporated herein by reference. This application is also related to U.S. patent application Ser. No. 08/439,011, entitled "Method of Protecting Electrostatic Chuck," filed on even date herewith, which is also incorporated herein by reference.

BACKGROUND

The present invention is directed to an electrostatic chuck for holding and positioning semiconductor substrates for processing of the substrate.

In semiconductor fabrication processes, electrostatic chucks are used to hold substrates for processing of the substrates. Generally, an electrostatic chuck comprises an insulator covering an electrode. Typically, the insulator and electrode are supported by a support adapted to be secured in a process chamber. An electrical connector electrically connects the electrode to a voltage supply source in the process chamber. When the electrode is electrically biased with respect to the substrate held on the chuck, opposing electrostatic charge accumulates in the electrode and substrate resulting in attractive electrostatic forces that hold the substrate to the chuck. Electrostatic chucks are generally described in, for example U.S. patent application Ser. Nos. 08/278,787 by Cameron, et al.; 08/276,735 by Shamouilian, et al.; and 08/189,562, by Shamouilian, et al. —all of which are incorporated herein by reference.

Conventional electrostatic chucks can also have coolant grooves for holding coolant for cooling the substrate held on the chuck, for example, coolant grooves extending through the insulator as described in U.S. patent application No. 08/276,735 to Shamouilian, et al. When a substrate is held on the chuck, the substrate covers and seals the coolant grooves so that the coolant held in the grooves does not leak out. Cooling of the substrate reduces overheating of the substrate to provide higher yields of integrated circuit chips from the substrate.

Conventional chucks can fail or have limited lifetimes in erosive process environments. For example, when the insulator of the chuck comprises a polymeric dielectric material, such as a polyimide, the polymeric insulator can be eroded by the erosive process environment, limiting the useful lifetime of the chuck. Erosion of polymeric insulators can be particularly severe in oxygen or halogen containing gases and plasmas, which are used for a variety of tasks, such as for example, etching of substrates and cleaning of process chambers. While a large portion of the polymeric insulator is typically covered by the substrate held on the chuck and thereby protected from the erosive environment, the periphery of the insulator is exposed to, and can be eroded by the erosive gaseous environment. The exposed polymeric insulator can erode in a few hours (typically 2 to 3 hours of exposure to a oxygen plasma environment), and erosion through a single point of the insulator can expose the electrode causing short-circuiting and failure of the chuck. Failure of the chuck during processing of the substrate can damage the substrate and reduce yields of the valuable integrated circuit chips processed on the substrate. Also, the polymeric byproducts formed by the erosion of the polymer dielectric often deposit on the chuck and walls of the process chamber to form hard polymeric deposits which are difficult to clean.

Thus, it is desirable to have an electrostatic chuck which demonstrates improved erosion resistance and reduced failure rates in erosive process environments. It is also desirable for the chuck to provide uniform cooling of the substrate held on the chuck to provide increased integrated circuit yields, particularly from the perimeter of the substrate.

SUMMARY

The erosion resistant electrostatic chuck of the present invention satisfies these needs. The electrostatic chuck is suitable for holding a substrate having a peripheral edge, in an erosive process environment. The chuck comprises an electrostatic member capable of electrostatically holding the substrate, the electrostatic member comprising (i) an electrode, and (ii) an insulator covering the electrode. A barrier is circumferentially disposed about the electrostatic member. The barrier has a first contact surface capable of being pressed against the peripheral edge of the substrate, so that the barrier can form a seal around the substrate to reduce exposure of the electrostatic member of the chuck to the erosive process environment.

In a preferred version, the electrostatic chuck further comprises a support for supporting the electrostatic member, and the barrier has a second contact surface capable of being pressed against the support so that the barrier can form a seal between the substrate and the support.

The barrier can comprise any resilient structure capable of pressing the first contact surface of the barrier against the electrostatically held substrate without dislodging the substrate. A preferred barrier structure comprises a ring having an annular lip that is capable of resiliently pressing and sealing against the peripheral edge of the substrate. Preferably, the barrier structure is fabricated from an elastomer.

DRAWINGS

These and other features, aspects, and advantages of the present invention will become better understood with regard to the following description, appended claims, and accompanying drawings which provide illustrative examples of the invention, where:

DESCRIPTION

Figure 1A:
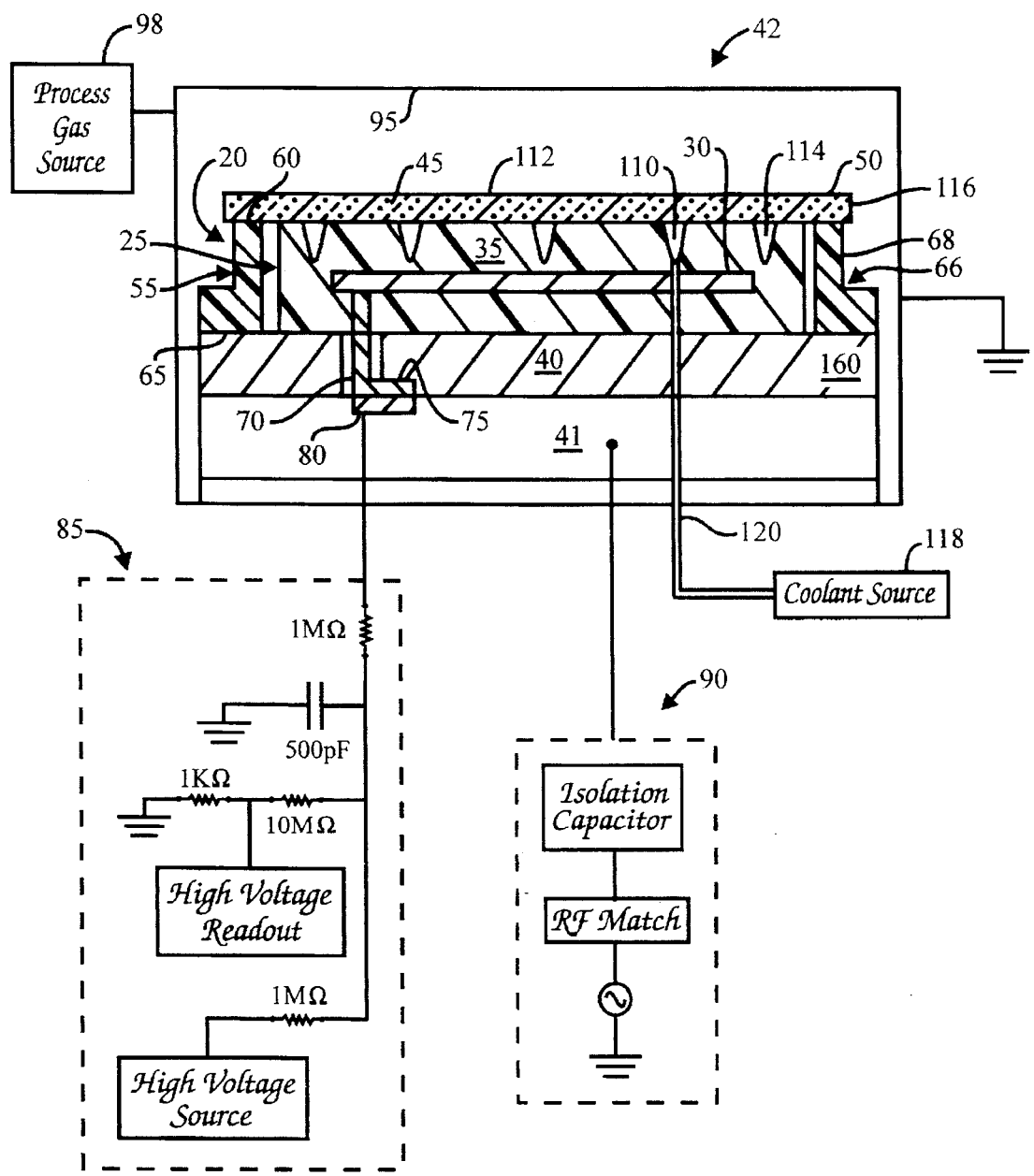
FIG. 1a is a schematic partial cross-section schematic view of a process chamber showing operation of a monopolar electrostatic chuck of the present invention.

With reference to FIG. 1a, an electrostatic chuck 20 according to the present invention generally comprises an electrostatic member 25 comprising an (i) an electrode 30, and (ii) an insulator 35 covering the electrode. Typically, the electrostatic member 25 is supported on a support 40 adapted to be secured to a process electrode, commonly known as a cathode 41, in a process chamber 42 containing an erosive process environment, for example, an oxygen plasma. A substrate 45, such as a silicon wafer, having a peripheral edge 50 is electrostatically held on the electrostatic member 25. A barrier 55 circumferentially disposed about the electrostatic member 25 comprises a first contact surface 60 capable of being pressed against the peripheral edge 50 of the substrate to form a seal around the substrate 45 to reduce exposure of the electrostatic member 25 to the erosive process environment. The barrier also typically includes a second contact surface 65 capable of being pressed against the support 40 so that the barrier 55 can form a seal between the substrate 45 and the support 40. A suitable barrier 55 configuration, as shown in FIG. 1a, comprises a ring 66 having a annular lip 68 capable of being resiliently pressed against the substrate 45 without dislodging the electrostatically held substrate 45.

With reference to FIG. 1a, operation of a single monopolar electrode chuck 20 in a process chamber 42 suitable for plasma processing of substrates, will now be described. The process chamber 42 is provided only to illustrate operation of the chuck 20, and should not be used to limit the scope of the invention. The electrostatic chuck 20 is secured to the cathode 41 in the process chamber 42 using screws around the circumference of the chuck 20. An electrical connector 70 with an electrical contact 75 is used to electrically connect the electrode 30 of the chuck 20 to a voltage supply terminal 80 on the cathode 41. A first voltage supply 85 provides a voltage to the terminal 80 to operate the chuck 20, and typically comprises a high voltage DC source of about 1000 to 3000 volts, connected to a high voltage readout, through a 10 MΩ resistor. A 1 MΩ resistor is provided in the circuit to limit the current flowing through the circuit, and a 500 pF capacitor is provided as an alternating current filter.

At least a portion of the cathode 41 is electrically conductive, typically aluminum, and functions as a process electrode for forming a plasma in the chamber 42. A second voltage supply 90 is connected to the cathode 41 to electrically bias the cathode 41 with respect to an electrically grounded surface 95 in the chamber 42. The second voltage supply 90 is conventional and typically comprises an RF impedance that matches the impedance of the process chamber 42 to the impedance of the line voltage. The RF impedance is connected in series with an isolation capacitor, as shown in FIG. 1a, which serves as an alternating current filter.

During operation of the chuck 20, a process gas from a process gas source 98 is introduced in the process chamber 42, and the second voltage supply 90 is activated to form a plasma from the process gas introduced in the process chamber 42. A substrate 45 is placed on the chuck 20 so that the peripheral edge 50 of the substrate contacts the first contact surface 60 of the barrier 55. When the electrode 30 is electrically biased with respect to the substrate 45 by the first voltage supply 85, electrically charged plasma species impinge on the substrate 45 causing opposing electrostatic charge to accumulate in the substrate 45 and electrode 30, resulting in an attractive electrostatic force that attracts and clamps the substrate 45 to the chuck 20. The electrostatic attractive force conformably presses the substrate 45 against the barrier 55 forming a seal around the substrate 45 to reduce exposure of the electrostatic member 25 to the erosive gas in the process chamber 42.

Figure 1B:
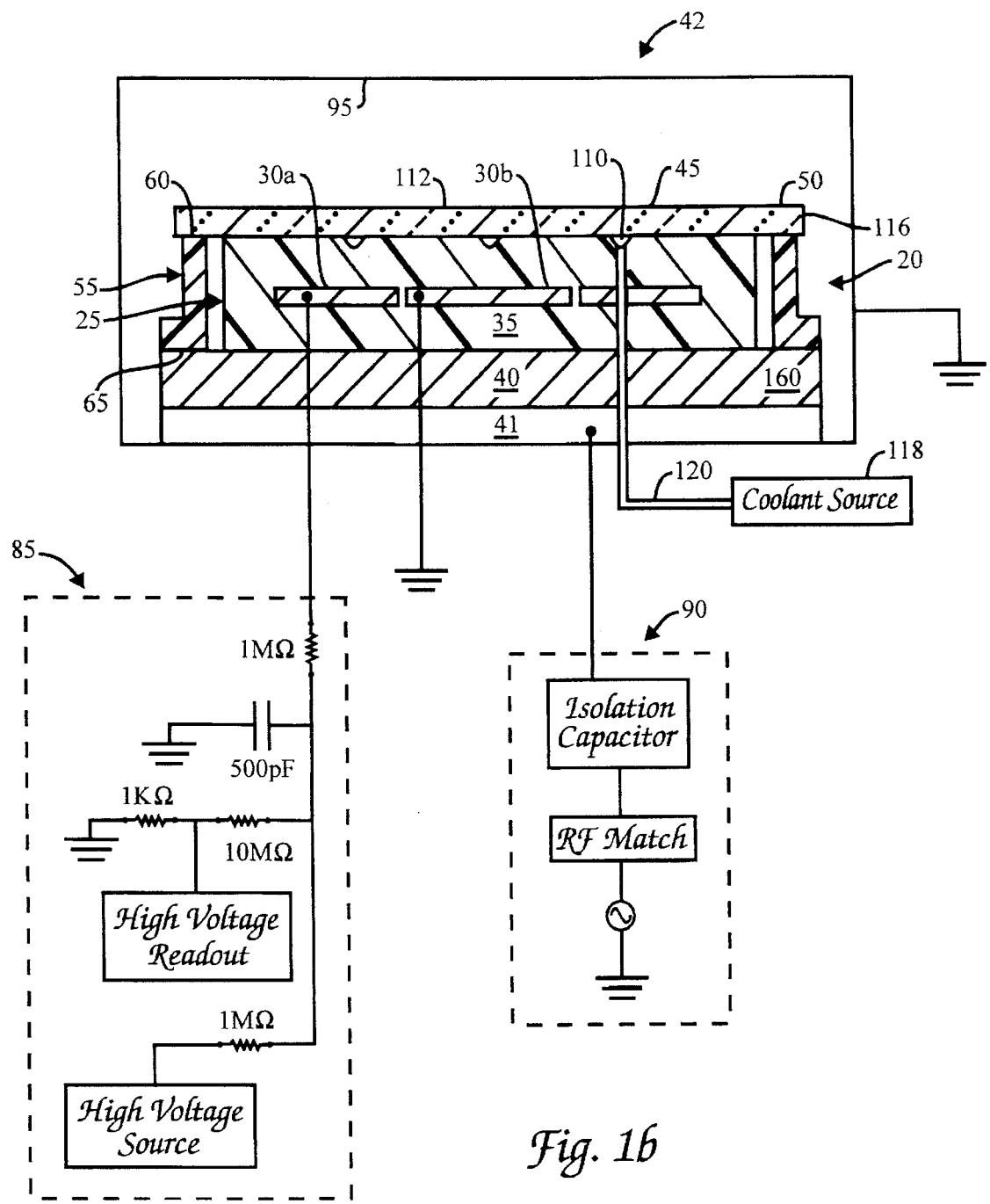
FIG. 1b is a partial cross-section schematic view of a process chamber showing operation of a bipolar electrostatic chuck of the present invention.

Instead of a single monopolar electrode 30, the chuck 20 can also comprise two or more bipolar electrodes 30a, 30b as shown in FIG. 1b, which are typically coplanar to one another and have substantially equivalent surface areas to generate substantially equivalent electrostatic attractive forces. Referring to FIG. 1b, the bipolar electrodes can be powered by a single voltage supply 85 connected to one of the electrodes 30a, with the other electrode 30b being connected to ground (as shown). When the two electrodes 30a, 30b are maintained at opposing polarities, opposing electrostatic charges accumulates in the substrate 45 and electrostatically holds the substrate 45 to the chuck 20 without use of electrically charged plasma species which serve as charge carriers for electrically biasing the substrate 45. Thus the bipolar electrode configuration is advantageous for nonplasma processes during which there are no charged plasma species. Alternatively, the voltage supply 85 can comprise two voltage sources (not shown), each of the voltage sources being separately connected to one of the electrodes 30a, 30b, which is useful for processes having plasma and non-plasma stages, as described in U.S. patent application Ser. No. 08/410,449, filed on Mar. 24, 1995, entitled "Electrostatic Chuck with Improved Erosion Resistance", by Shamouilian, et al., which is incorporated herein by reference.

Figure 2:
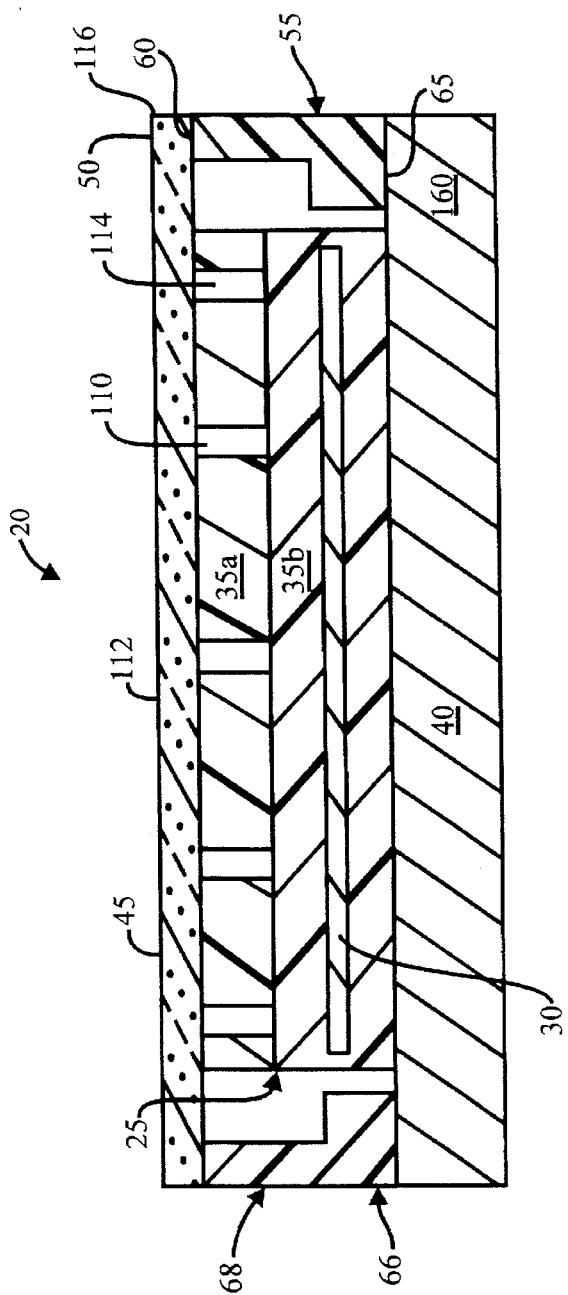
FIG. 2 is a cross-section side schematic view of a version of the chuck of the present invention, showing a barrier around the chuck.

The electrostatic chuck 20 can also comprise coolant grooves 110 in the electrostatic member 25, the grooves 110 sized and distributed to hold coolant for absorbing heat from the substrate 45 to cool the substrate 45. Typically, the coolant grooves 45 form a pattern of radial and circumferential intersecting channels extending from below the center 112 of the substrate 45, and having groove tips 114 positioned close to the perimeter 116 of the substrate 45, as shown in FIG. 2. Preferably, the gap between the coolant groove tips 114 and the perimeter 116 of the substrate 45 is less than about 10 mm, more preferably less than 5 mm, and most preferably less than about 3 mm, as described in aforementioned copending U.S. patent application, entitled "Corrosion Resistant Electrostatic Chuck With Improved Cooling System." When a substrate 45 is electrostatically held on the chuck 20, the substrate 45 covers the coolant grooves 110 and seals the groove tips 114 so that coolant does not leak out from the groove tips 114. A coolant source 118, such as a tank of compressed helium, is used to supply coolant to the coolant grooves 110 via a supply line 120, as shown in FIG. 1a.

Preferred configurations for the barrier 55 will now be described. The barrier 55 can have any configuration or structure that has a first contact surface 60 capable of being pressed against the substrate 45 to form a seal around the substrate 45 to reduce exposure of the electrostatic member 25 to the erosive gas in the process chamber 42. Preferably, the surface area of the first contact surface 60 of the barrier 55 is sufficiently small that the barrier 55 does not act as a thermally insulator that reduces heat flow from the substrate 45. It has been discovered that if the area of the first contact surface 60 is too large, the barrier 55 acts as a thermal insulator and raises the temperature of the perimeter 116 of the substrate 45 at those regions close to the contact surface 65. Thus preferably the contact area of the first contact surface 60 of the barrier 55 is sufficiently small that the barrier is substantially not thermally insulative, and allows the perimeter 116 of the substrate 45 to be maintained at temperatures less than about 100° C., and more preferably less than about 80° C. Preferably, the contact area for the first contact surface 60 of the barrier 55 is less than about 100 mm$^2$, and more typically less than about 300 mm$^2$, and often less than about 500 mm$^2$.

Preferably, the first contact surface 60 of the barrier 55 is located sufficiently close to the perimeter 116 of the substrate 45, that when the substrate is cooled, the coolant in the grooves 110 can maintain the temperatures at the perimeter 116 of the substrate 45 substantially equivalent to the temperatures at the center 112 of the substrate 45. By "substantially equivalent" it is meant that the difference in average temperatures of the perimeter 116 and center 112 of the substrate is less than about 10° C., more preferably less than about 7° C., and most preferably less than about 5° C. Typically, the first contact surface 60 of the barrier 55 contacts the peripheral edge 50 of the substrate 45 within about 10 mm, and more preferably 5 mm, from the perimeter 116 of the substrate 45.

The barrier 55 can also comprise a second contact surface 65 capable of being pressed against the support 40 so that the barrier can form a seal between the substrate 45 and the support 40. This barrier configuration facilitates quick removal and replacement of the barrier 55 which can be useful for highly erosive process environments. The area of the second contact surface 65 of the barrier 55 is sized sufficiently large to allow the barrier to securely contact and seal against the support 40. Typically, the area of the second contact surface 65 is at least about 150 mm$^2$, and more typically from about 200 to 400 mm$^2$.

Preferably, the barrier 55 comprises a resilient structure capable of conforming and sealing the first contact surface 60 of the barrier against the peripheral edge 50 of the substrate 45 under application of an electrostatic force generated by the electrostatic member 25, without dislodging the electrostatically held substrate 45. For example, a suitable barrier 55 configuration, as shown in the figures, comprises a ring 66 circumferentially disposed about the electrostatic member 25 and having a annular lip 68 capable of being resiliently pressed against the electrostatically held substrate 45. Typically, the electrostatic member 25 exerts an electrostatic attractive force per unit area (force/area) on the substrate 45 of at least about 5 Torr, and more typically from 10 to 70 Torr, and most typically from about 30 to about 50 Torr. Thus, the barrier 55 is sufficiently resilient to allow the first contact surface 60 to press against the substrate 45 with a force less than the electrostatic attractive force exerted by the electrostatic member 25 on the substrate 45, (i) to prevent movement and dislodging of the substrate, and (ii) when necessary, to allow the substrate 45 to seal the tips 114 of the coolant grooves 110 in the electrostatic member 25 without allowing coolant to leak out from the coolant groove tips 114.

In a preferred chuck configuration 20, the peripheral edge 50 of the substrate 45 overhangs a periphery 160 of the support 40 that extends beyond the electrostatic member 25. The overhanging peripheral edge 50 of the substrate 45 increases the erosion resistance of the electrostatic member 25 by reducing line-of-sight impact of highly energetic plasma species (having energies in excess of 1000 eV) on the exposed sides of the electrostatic member 25. With reference to FIG. 2, a barrier 55 suitable for the preferred chuck configuration includes (i) a ring-shaped base 150 resting on the support 40, and (ii) an arm 155 extending from the base 150 at least a portion of the arm capable of resiliently pressing against the peripheral edge 50 of the substrate 45, as shown in FIGS. 2 and 3a–3d. In the configurations shown in FIGS. 2, 3a and 3b, the base 150 rests on the periphery 160 of the support 40 that extends below the substrate 45. In the configurations shown in FIGS. 3c and 3d, the collar ledge 160 includes a channel 175 therein, and the base of the barrier 55 is sized to fit within the channel 175. In the configuration shown in FIG. 3d, the channel 175 is in a sidewall 180 of the collar ledge, and the base 150 is sized to fit in the sidewall channel 175. It is preferred to have a channel 175 in the collar ledge 160 so that the base 150 of the barrier 55 can be securely held by the channel 175 to prevent movement or misalignment of the barrier 55 during use of the chuck 20.

Figure 3B:
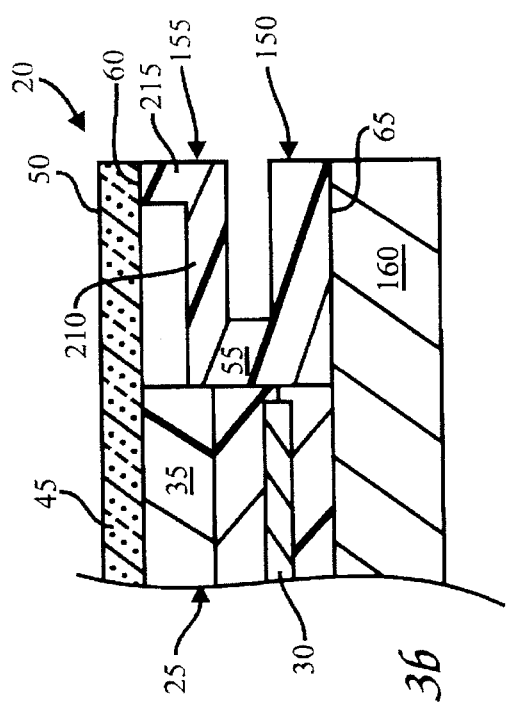
FIG. 3b is a partial cross-section side schematic view of a third version of the chuck of the present invention.
Figure 3A:
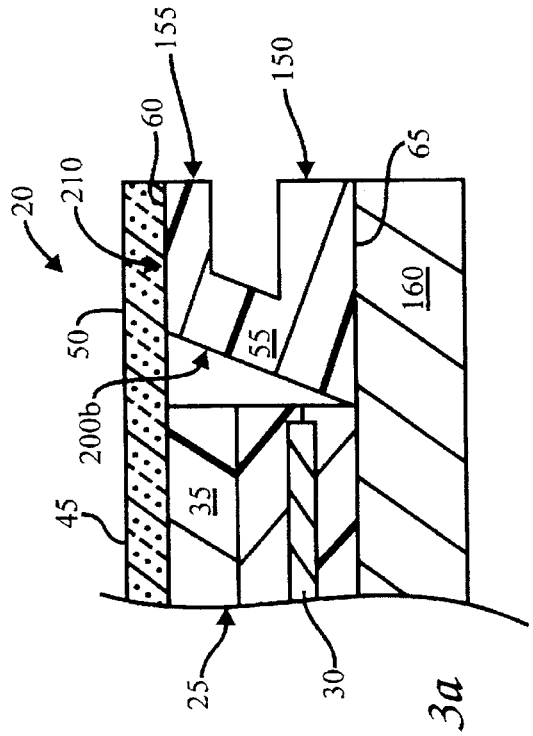
FIG. 3a is a partial cross-section side schematic view of a second version of the chuck of the present invention.
Figure 3C:
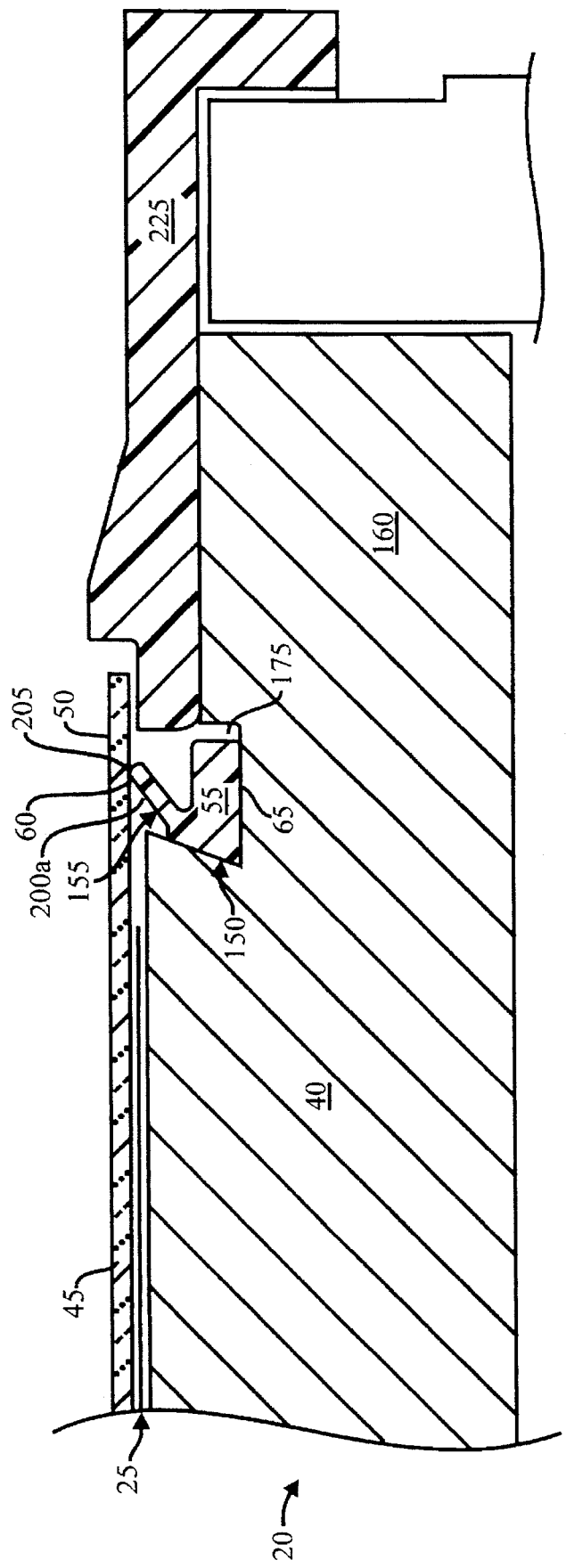
FIG. 3c is a partial cross-section side schematic view of a fourth version of the chuck of the present invention, showing a collar around the chuck.
Figure 3D:
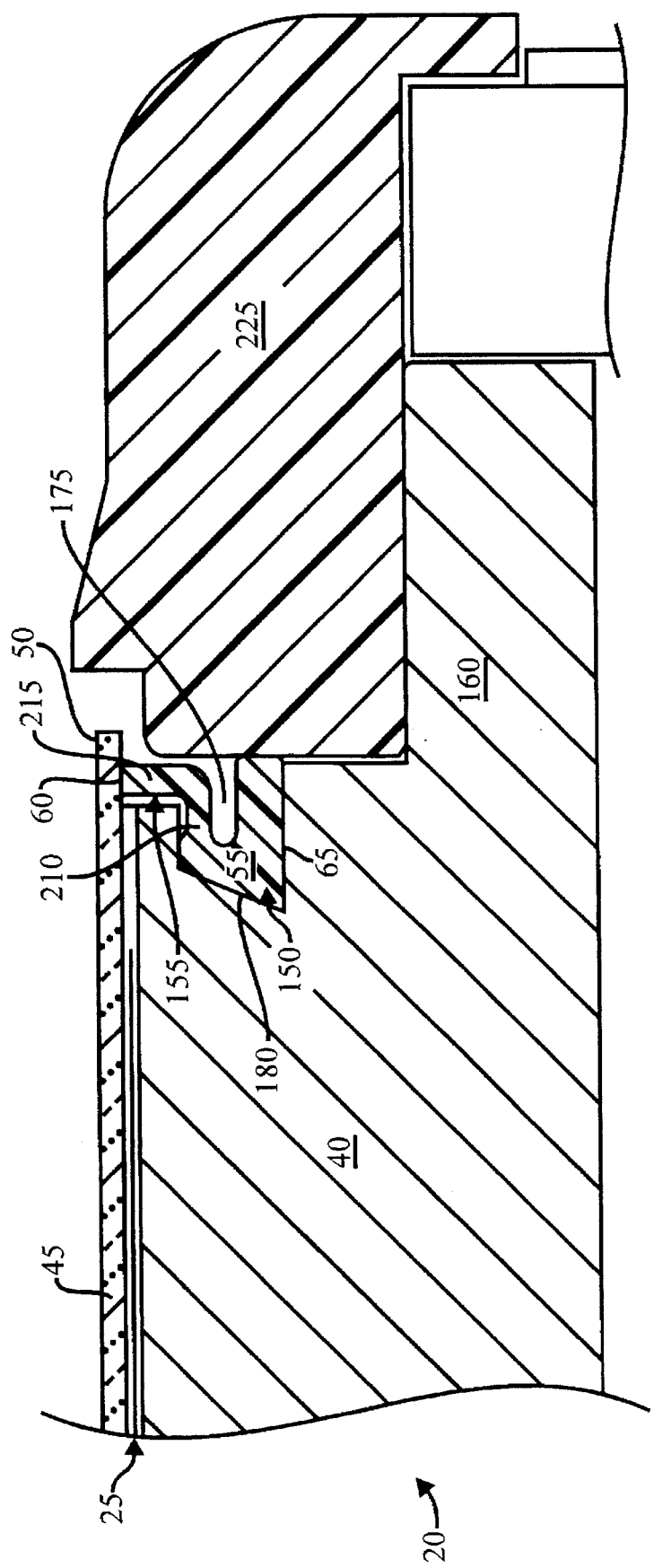
FIG. 3d is a partial cross-section side schematic view of a fifth version of the chuck of the present invention, showing a collar around the chuck.
Figure 4:
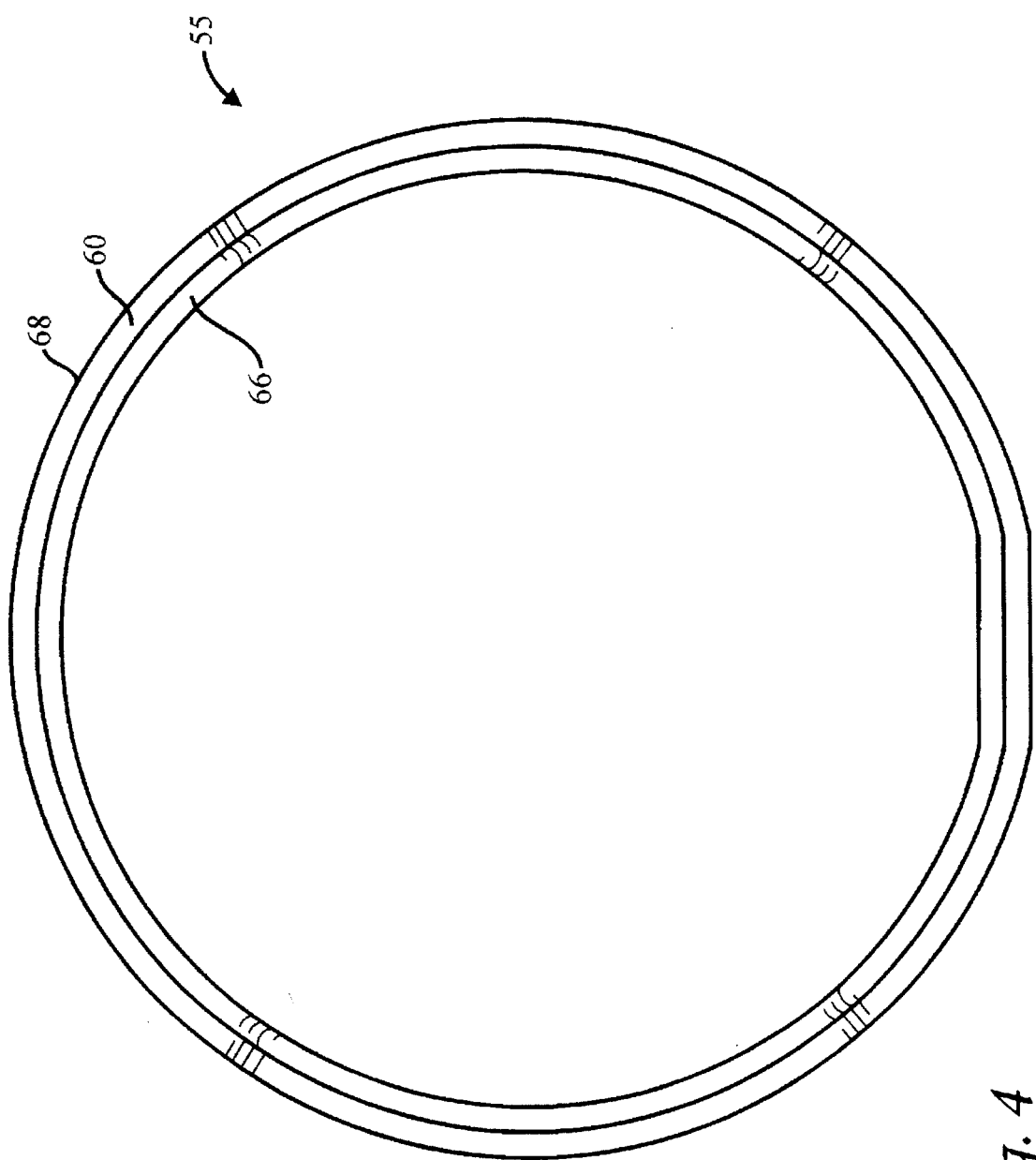
FIG. 4 is a top view of the barrier of the chuck shown in FIG. 2.

Preferably, the lip 68 or arm 155 of the barrier 55 serves as a cantilever which extends outwardly and upwardly from the ring 66 or base 150. The cantilever configuration is advantageous because it allows the arm 155 to press against the peripheral edge 50 of the substrate 45 at a substantially small contact area of the first contact surface 60 to provide adequate sealing against the substrate 45. For example, FIG. 3c shows a cantilever configuration comprising an inclined member 200a attached to the base 150 at one end, and having a distal end 205 which conformably presses against the substrate 45 at the first contact surface 60. FIG. 3a shows a cantilever configuration comprising a horizontal member 210 extending from an inclined member 200b, the upper surface of the horizontal member 210 forming the first contact surface 60 conformably pressed against the substrate 45. In FIGS. 3b and 3d, the cantilever arm 155 includes a substantially vertical member 215 attached to one end of the horizontal member 210, the vertical member 215 having an edge that conformably presses against the substrate 45 forming the first contact surface 60.

The barrier 55 of the present invention provides significantly improved erosion resistance with substantially longer chuck lifetimes. For example, where prior art chucks typically erode and fail after about 3 hours of exposure to oxygen plasmas, a chuck 20 of the present invention with a barrier 55 provided about 500 hours of erosion resistance without failure on exposure to oxygen plasma. Furthermore, the barrier 55 also substantially reduced the accumulation of polymeric reaction byproducts on the chuck 20, when the chuck was used to hold substrates 45 in erosive process environment.

The erosion resistance of the chuck can be further increased using a circumferential collar ring 225 around the chuck 20, as shown in FIGS. 3c and 3d. A masking gas assembly that directs an inert masking gas onto the periphery of the electrostatic member 25, as described in aforementioned U.S. patent application Ser. No. 08/410,449, can also be used to enhance erosion resistance of the chuck 20.

Methods of manufacturing the chuck 20 will now be discussed.

Support

Generally, the support 40 used to support the electrostatic member 25 is shaped and sized according to the shape and size of the substrate 45 to maximize the heat transfer surface between the support 40 and the substrate 45. For example, if the substrate 45 is disk shaped, a right-cylindrical support 40 is preferred. Typically, the support 40 has a central portion which receives the electrostatic member 25 and a periphery 160 which extends beyond the electrostatic member 25. The periphery 160 of the support 40 can be shaped as a collar ledge which is at a reduced height from the central portion of the support 40 so that the support 40 resembles a pedestal. Preferably, a channel 175 is formed in the periphery 160, or in the circumferential sidewall 180 of the periphery 160, to hold the barrier 55.

The support 40 is typically machined from aluminum and has a right cylindrical shape, with a diameter of about 100 to 300 mm to match the diameter of the substrate 45 which typically ranges from about 127 to about 203 mm (5–8 inches), and a thickness of about 1.5 to 2 cm. The top and bottom surfaces of the aluminum plate are ground using conventional aluminum grinding techniques, until the surface roughness of the plate is less than about 1 micron. Surface grinding of the plate is essential for the support 40 to uniformly contact the cathode 41 and the substrate 45 placed on the support 40, to allow for efficient thermal transfer between the substrate 45, the support 40, and the cathode 41. After grinding, the plate is thoroughly cleaned to remove grinding debris.

Insulator

The electrostatic member 25 of the chuck 20 comprises an (i) an electrode 30, and (ii) an insulator 35 covering the electrode. The insulator 35 typically comprises a resilient polymeric dielectric material, such as polyimide, polyketone, polyetherketone, polysulfone, polycarbonate, polystyrene, nylon, polyvinylchloride, polypropylene, polyethersulfone, polyethylene terephthalate, fluoroethylene propylene copolymers, cellulose, triacetates, silicone, and rubber. When a polymer such as polyimide is used, the resilience of the polyimide, as measured by the tensile elastic modulus of the polyimide, is preferably from about 0.25 to about 10 GPa, and more preferably from about 1 to about 5 GPa. Typical polymeric insulators have (i) a dielectric constant of at least about 2, and more preferably at least about 3; (ii) a resistivity ranging from about $10^{13}$ Ω cm to $10^{20}$ Ω cm; and (iii) a dielectric breakdown strength of at least about 100 volts/mil (3.9 volts/micron), and more typically at least about 1000 volts/rail (39 volts/micron).

The insulator 35 is sized sufficiently large to cover, and more preferably enclose the electrode 30. The thickness of the insulator 35 required to electrically insulate the electrode 30 varies according to the electrical resistivity and dielectric constant of the polymer used to form the insulator 35. The insulator 35 should have a sufficient thickness to conform to the substrate 45 under the electrostatic clamping force applied on the substrate 45 so that the coolant grooves 110 on the electrostatic member 25 are substantially sealed by the substrate 45. When the polymer has a dielectric constant of about 3.5, the insulator 35 is typically about 10 μm to about 500 μm thick, and preferably from about 100 μm to about 300 μm thick.

Preferably, the polymeric insulator is resistant to temperatures in excess of 50° C., and more preferably resistant to temperatures in excess of 100° C., so that the chuck 20 can be used in processes where the substrate 45 is heated. Also, preferably, the polymeric insulator has a high thermal conductivity so that heat generated in the substrate 45 during processing can dissipate through the chuck 20. The thermal conductivity of the insulator 35 should be at least about 0.10 Watts/m/K, to allow sufficient heat transfer to preclude overheating of the substrate 45.

The insulator 35 can also include a high thermal conductivity filler material, such as diamond, alumina, zirconium boride, boron nitride, and aluminum nitride for increasing the thermal conductivity and resistance to plasma corrosion. Preferably, the filler material is a powder with an average particle size of less than about 10 μm. Typically, the filler is dispersed in the insulator material in a volumetric ratio from about 10% to 80%, and more typically from about 20% to 50%.

ELECTRODE

The electrode 30 of the electrostatic member 25 is typically made from an electrically conductive material, such as for example, metals including copper, nickel, chromium, aluminum, iron, and alloys thereof. Typically, the thickness of the electrode 30 is from about 0.5 to 100 μm, and more preferably the thickness is of the electrode is from about 1 μm to 50 μm, the thinner electrode providing enhanced erosion resistance for the chuck 20. The shape of the electrode 30 varies according to the size and shape of the substrate 45. For example, if the substrate 45 is disk shaped, the electrode 30 is also disk shaped to maximize the area of the electrode 30 in contact with the substrate 45. Typically, the electrode 30 has an area of from about 200 to about 400 cm$^2$, and more typically from 250 to 350 cm$^2$.

The electrode 30 in the chuck 20 can have several different configurations. In one configuration, the electrode 30 is a single continuous or patterned electrode, capable of operating as a unipolar electrode 30, as shown in FIG. 1a. In another configuration the electrode 30 comprises two bipolar electrodes 30a, 30b, as shown in FIG. 1b. Preferably, each of the bipolar electrodes 30a, 30b have substantially equal sizes and shapes.

Preferably, the electrode 30 is fabricated as an electrically conductive layer, such as a metal layer, embedded in an insulative layer 35 of a commercially available insulator material. As shown in FIG. 2, the insulative layer 35 can comprise an upper insulator layer 35a made of more elastic polymeric layer that allows cushioning and sealing of the coolant grooves 110, and the lower insulator layer 35b made of a more dielectric polymer to provide optimal electrical insolation of the electrode 30. Preferred multilayer insulator configurations are for example described in aforementioned U.S. patent application Ser. No. 08/369,237. Typically, the thickness of each insulator layer is from about 50 μm to about 100 μm. Suitable commercially insulative polymer films include for example, "KAPTON," a polyimide film manufactured by DuPont de Nemours Co., Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan.

The coolant grooves 110 are cut through one or both insulative layers of the multilayer insulator by stamping, pressing, or punching the grooves through the insulator 35. Preferably, the grooves cut through only the upper insulative layer 35a with the tips of the grooves 114 extending close to a peripheral edge 116 of the substrate 45. After forming the coolant grooves 110, the multilayer insulator and electrode assembly is centered on, and adhered to the support 40 of the chuck 20. Conventional adhesives are used to adhere the insulative layers 35a, 35b together, the adhesives including (i) thermally activated adhesives which are non-tacky at room temperatures and tacky at elevated temperatures, or (ii) pressure sensitive adhesives which are tacky under pressure. Suitable adhesives include for example acrylics such as methacrylate, polyesters, polyamides, polyurethanes, epoxies, silicone containing adhesives, and mixtures thereof.

Methods of fabricating the insulator laminate are generally described in the U.S. patent application Ser. No. 08/199,916, entitled "Electrostatic Chuck with Erosion-Resistant Electrode Connection," filed Feb. 2, 1994, by Shamouilian, et al.

Another method for fabricating the electrostatic member 25 uses a multilayer film, comprising an insulator layer having an electrically conductive copper or aluminum layer thereon. Suitable commercially available multilayer films include for example, "R/FLEX 1100" film comprising a 25 to 125 μm thick polyimide film with a copper layer deposited thereon, from Rogers Corporation, Chandler, Az.; Ablestik brand aluminum-filled polyimide film available from Ablestik Corporation; and Paralux® AP film, comprising polyimide directly bonded (without an adhesive) to rolled, annealed, or electrodeposited copper foil. A second insulator film is adhered over the electrically conductive layer of the multilayer film, to embed the conductive layer between two insulator films.

The electrostatic member having a patterned or segmented electrode 30 embedded in the insulator 35 is fabricated by selecting a multilayer film having an electrically conductive layer, such as the previously described "R/FLEX 1100" film, and etching, routing or milling the conductive layer to form the desired segmented electrode configuration. Conventional photolithographic and etching methods can be used to etch the electrode 30, for example by (i) forming a patterned photoresist layer of "RISTON" fabricated by DuPont de Nemours Chemical Co. on the conductive metal layer using conventional photolithographic methods, as generally described in *Silicon Processing for the VLSI Era, Volume 1: Process Technology*, Chapters 12, 13, and 14, by Stanley Wolf and Richard N. Tauber, Lattice Press, Calif., (1986), which is incorporated herein by reference, and (ii) etching the exposed portions of the conductive layer using conventional wet or plasma etching techniques. In a typical wet chemical etching method the multilayer film is immersed in an etchant such as ferric chloride, sodium persulfate, or into an acid or base. A typical plasma etching processes uses a plasma of chlorine, oxygen, or $SiCl_4$, to etch the conductive layer, as generally described in *VLSI Technology, Second Edition*, Chapter 5, by S. M. Sze, McGraw-Hill Publishing Company (1988), which is incorporated herein by reference. Residual photoresist can be removed using a conventional acid or oxygen plasma stripping process. After etching, a second insulator film is adhered over the patterned electrode 30 to embed the electrode 30 within the insulator 35, as described above.

Electrical Connector

The electrostatic member 25 is connected to the terminal 80 via an electrical connector 70. Preferably, the electrical connector 70 extends through the support 40, rather than around the edge of the support 40, so that during processing the substrate 45 covers the electrical connector 70 and reduces exposure of the connector 70 to the erosive process gases in the chamber 42. Preferred electrical connectors 60 are described in aforementioned U.S. patent application Ser. No. 08/410,449.

Barrier

Preferably, at least a portion of the barrier 55 is fabricated from a resilient polymer that is substantially resistant to chemical degradation and erosion by the erosive process gas. Suitable polymers include for example, polyethylene, polyurethane, polycarbonate, polystyrene, nylon, polypropylene, polyvinylchloride, polyethylene terephthalate, fluoroethylene propylene copolymers, and silicone.

Preferred resilient polymers include elastomers, such as for example, natural rubber (with an elastic modulus of 2500 psi), "SBR" (2500 psi), acrylate, butyl (1000 psi), chlorosulfonated polyethylene, "EPDM", epichlorohydrin, fluorinated rubbers (250 psi), neoprene (1000 psi), nitrile (1500 psi), polybutadiene, polyisoprene (2500 psi), polysulfide (1400 psi), silicone, and urethane (1200 psi). The reported modulus values which range from 250 to 2500 psi, and more typically 1000 to 2000 psi, were measured at 300–400% elongation. Elastomers are generally described in *Textbook of Polymer Science*, Third Edition, Fred W. Billmeyer, John Wiley & Sons, New York, 1984, which incorporated herein by reference. Preferred commercially available erosion resistant elastomers include halogenated elastomers, such as "VITQN," a fluorine containing elastomer and "CHEMRAZ-570" perfluoroelastomers, both commercially available from Greene Tweed, Culpsville, Penna. Alternative materials include "TEFLON," a fluoropolymer commercially available from Dupont de Nemours, Wilmington, Del. The barrier 55 can be fabricated using conventional injection molding or casting methods.

Operation of the Chuck

Referring to FIG. 1a, typical operation of the chuck 20 for holding a substrate 45 in a process chamber 42 is now described. To effect the process, the process chamber 42 is evacuated to a pressure ranging from about 1 to about 500 mTorr, and more typically from about 10 to about 100 mTorr. A semiconductor substrate 45, such as a silicon wafer, is transferred to the chamber 42 from a load lock transfer chamber (not shown), and placed on the electrostatic member 25 of the chuck 20 in the chamber 42. Process gas is introduced in the process chamber 42, the type of process gas varying according to whether the substrate 45 is etched or whether material is deposited on the substrate 45. Conventional etchant gases include for example, $Cl_2$, $BCl_3$, $CCl_4$, $SiCl_4$, $CF_4$, $NF_3$, and mixtures thereof, as described in S. Wolf and R. N. Tauber, *Silicon Processing for the VLSI Era*, Vol. I, Chap. 16: Dry Etching for VLSI, Lattice Press, Sunset Beach, Calif. (1986), which is incorporated herein by reference.

The second voltage supply 90 is then activated to electrically bias the cathode 41 with respect to the grounded surface 95 in the chamber 42 to form a plasma from the process gas for etching the substrate 45. Activating the first voltage supply 85 applies a sufficient voltage to the electrode 30 in the electrostatic member 25 to electrical bias the electrode 30 with respect to the substrate 45 to generate a sufficient electrostatic force to attract holds the substrate 45 to the chuck 20, pressing the peripheral edge 116 of the substrate 45 against the first contact surface 60 of the barrier 55 to form a seal between the substrate 45 and the support 40 to protect the electrostatic member 25 from exposure to the erosive environment in the chamber 42.

During the process, the coolant source 118 provides the coolant, typically helium, to the coolant grooves 110 in the electrostatic member 25. The flow of the coolant beneath the substrate 45 removes heat from the substrate 45 to maintain substantially uniform temperatures across the substrate 45 during its processing.

Electrostatic chucks having features of the present invention have several advantages. The barrier 55 enhances the erosion resistance of the chuck 20, by protecting the electrostatic member 25 of the chuck 20 from exposure to the erosive process gases in the process chamber 42, thereby significantly improving the useful lifetime of the chuck 20 in erosive environments. Further, the barrier 55 substantially reduces accumulation of polymeric reaction byproducts on the chuck 20, when the chuck was used to hold substrates 45 in erosive processes. Also, the barrier 55 allows uniform cooling of the substrate 45.

While the present invention has been described in considerable detail with reference to certain preferred versions, many other versions should be apparent to those skilled in the art. For example, although illustrative barrier configuration 55 as are described herein, the barrier 55 can comprise any resilient structure that would be apparent to one of ordinary skill in the art, such as for example, a rubber ring seal. Therefore, the spirit and scope of the appended claims should not be limited to the description of the preferred versions contained herein.

What is claimed is:

1. An erosion resistant electrostatic chuck for holding a substrate having a peripheral edge, in an erosive environment, the chuck comprising:
    (a) an electrostatic member for electrostatically holding the substrate, the electrostatic member comprising (i) an electrode, and (ii) an insulator covering the electrode; and
    (b) a barrier circumferentially disposed about the electrostatic member, the barrier comprising (i) a planar base suitable for resting on the periphery of the support, and (ii) an arm extending upwardly from the base, the arm comprising a first contact surface capable of being conformally pressed against the peripheral edge of the substrate to form a seal between the substrate and the support to reduce exposure of the electrostatic member to the erosive environment.

2. The electrostatic chuck of claim 1, wherein the arm of the barrier extending upwardly from the base, comprises a cantilever structure sufficiently resilient to press the first contact surface against the electrostatically held substrate without dislodging the substrate.

3. The electrostatic chuck of claim 2, wherein the electrostatic member exerts an electrostatic attractive force/area on the substrate of at least about 5 Torr, and wherein the cantilever structure presses against the substrate with a force less than the electrostatic attractive force/area exerted on the substrate.

4. The electrostatic chuck of claim 1, further comprising a support for supporting the electrostatic member, and wherein the planar base of the barrier further comprises a second contact surface capable of being pressed against the support so that the barrier can form a seal between the substrate and the support.

5. The electrostatic chuck of claim 1, wherein the base of the barrier comprises a ring, and wherein the arm of the barrier comprises an annular lip extending outwardly from the base, the annular lip capable of being resiliently pressed against the substrate without dislodging the electrostatically held substrate.

6. The electrostatic chuck of claim 5, wherein the electrostatic member further comprises coolant grooves for holding coolant at a pressure below the substrate, the coolant grooves having tips close to the peripheral edge of the substrate, and
    wherein the annular lip of the barrier comprises a cantilever structure sufficiently resilient to press the first contact surface conformally against the substrate substantially without causing coolant to leak out from the coolant grooves tips.

7. The electrostatic chuck of claim 5, wherein the barrier is fabricated from a resilient and pliant material capable of conforming and forming a seal between the substrate and support.

8. The electrostatic chuck of claim 7, wherein the barrier is fabricated from an elastomer that is substantially resistant to erosion by the erosive process gas.

9. The electrostatic chuck of claim 8, wherein the elastomer comprises a halogenated elastomer.

10. The electrostatic chuck of claim 1, further comprising a support for supporting the electrostatic member, wherein the peripheral edge of the substrate overhangs the support, and wherein the barrier comprises an arm comprising at least one horizontal, vertical, or inclined member, the member having one end attached to the base and another end extending above and over the base to contact the substrate.

11. The electrostatic chuck of claim 10, wherein the support comprises a peripheral sidewall having a channel therein, and wherein the base of the barrier is sized to fit in the channel in the support.

12. The electrostatic chuck of claim 1, wherein the substrate comprises a center and a perimeter, and wherein the first contact surface of the arm of the barrier has a sufficiently small contact area located sufficiently close to the perimeter of the substrate that when the substrate is heated, the difference in temperatures between the center and perimeter of the substrate is less than about 10° C.

13. The electrostatic chuck of claim 12, wherein the contact area of the first contact surface of the arm of the barrier is less than about 500 mm².

14. The electrostatic chuck of claim 12, wherein substantially the entire first contact surface of the arm of the barrier contacts the substrate within about 10 mm from the perimeter of the substrate.

15. An erosion resistant electrostatic chuck for holding a substrate having a peripheral edge in an erosive environment, the chuck comprising:
    (a) an electrostatic member for electrostatically holding the substrate, the electrostatic member comprising (i) an electrode, and (ii) an insulator covering the electrode;
    (b) a support for supporting the electrostatic member, the support having a periphery below the peripheral edge of the substrate; and
    (c) a barrier disposed on the periphery of the support, the barrier having (i) a cantilever arm including a first contact surface capable of being pressed against the peripheral edge of the substrate, and (ii) a base supporting the cantilever arm, the base having a second contact surface capable of being pressed against the periphery of the support, so that the barrier can form a seal between the substrate and the support to reduce exposure of the electrostatic member to the erosive environment.

16. The electrostatic chuck of claim 15, wherein the base of the barrier comprises a ring resting on the support and the cantilever arm comprises a resilient annular lip extending toward the substrate.

17. The electrostatic chuck of claim 16, wherein the electrostatic member further comprises coolant grooves for holding coolant at a pressure below the substrate, the coolant grooves having tips close to the peripheral edge of the substrate, and
    wherein the cantilever arm is sufficiently resilient to conformally press and seal the resilient annular lip against the substrate (i) substantially without causing coolant to leak out from the coolant grooves tips, and (ii) substantially without dislodging the electrostatically held substrate.

18. The electrostatic chuck of claim 16, wherein the substrate comprises a center and a perimeter, and wherein the resilient annular lip of the cantilever arm contacts the substrate at a sufficiently small contact area located sufficiently close to the perimeter of the substrate that when the substrate is heated, the difference in temperatures between the center and perimeter of the substrate is less than about 10° C.

19. The electrostatic chuck of claim 16, wherein the barrier is made of a halogenated elastomer.

20. The electrostatic chuck of claim 15, wherein the electrostatic member exerts an electrostatic attractive force/area on the substrate of at least about 5 Torr, and wherein the cantilever arm presses against the substrate with a force less than the electrostatic attractive force/area exerted on the substrate.

21. The electrostatic chuck of claim 15, wherein the barrier is fabricated from a resilient and pliant material capable of forming a conformal seal between the substrate and support.

22. The electrostatic chuck of claim 21, wherein the barrier is fabricated from an elastomer that is substantially resistant to erosion by the erosive process gas.

23. The electrostatic chuck of claim 22, wherein the elastomer comprises a halogenated elastomer.

24. The electrostatic chuck of claim 15, wherein the peripheral edge of the substrate overhangs the support, and wherein the barrier comprises an arm comprising at least one horizontal, vertical, or inclined member, the member having one end attached to the base and another end extending above and over the base to contact the substrate.

25. An erosion resistant electrostatic chuck for holding a substrate having a peripheral edge in an erosive environment, the chuck comprising:

(a) an electrostatic member for electrostatically holding the substrate, the electrostatic member comprising (i) an electrode, and (ii) an insulator covering the electrode; and (b) a barrier ring circumferentially disposed about the electrostatic member, the barrier ring having an upwardly extending cantilever arm sufficiently resilient and conformal to form a seal against the peripheral edge of the substrate under application of the electrostatic force generated by the electrostatic member, without dislodging the electrostatically held substrate, to reduce exposure of the electrostatic member to the erosive environment.

26. The electrostatic chuck of claim 25, further comprising a support, and wherein the barrier ring comprises a conformal surface that rests on the support so that the barrier can form a seal extending between the substrate and the support.

27. The electrostatic chuck of claim 25, wherein the electrostatic member exerts an electrostatic attractive force/area on the substrate of at least about 5 Torr, and wherein the upwardly extending cantilever arm or the barrier ring presses against the substrate with a force less than the electrostatic attractive force/area exerted on the substrate.

28. The electrostatic chuck of claim 25, wherein the barrier ring is fabricated from a resilient and pliant material capable of forming a conformal seal between the substrate and support.

29. The electrostatic chuck of claim 28, wherein the barrier ring is fabricated from a halogenated elastomer that is substantially resistant to erosion by the erosive process gas.

30. The electrostatic chuck of claim 25, further comprising a support for supporting the electrostatic member, wherein the peripheral edge of the substrate overhangs the support, and wherein the upwardly extending cantilever arm of the barrier ring comprises at least one horizontal, vertical, or inclined member, the member having one end attached to the base and another end extending above and over the barrier ring to contact the substrate.

31. The electrostatic chuck of claim 25, wherein the electrostatic member further comprises coolant grooves for holding coolant at a pressure below the substrate, the coolant grooves having tips close to the peripheral edge of the substrate, and wherein the upwardly extending cantilever arm of the base is sufficiently resilient to conformally press against the substrate substantially without causing coolant to leak out from the coolant grooves tips.

32. The electrostatic chuck of claim 25 wherein the substrate comprises a center and a perimeter, and wherein the upwardly extending cantilever arm of the barrier has a sufficiently small contact area located sufficiently close to the perimeter of the substrate that when the substrate is heated, the difference in temperatures between the center and perimeter of the substrate is less than about 10° C.

33. A method of enhancing the erosion resistance of an electrostatic chuck in an erosive environment, the chuck comprising (i) a electrostatic member capable of electrostatically holding a substrate, and (ii) a support for supporting the electrostatic member, the method comprising the steps of:

(a) positioning a barrier circumferentially about the electrostatic member, the barrier comprising (i) a base resting on the support, and (ii) a cantilever arm extending from the base, the cantilever arm having a conformal contact surface capable of forming a seal against the substrate;

(b) placing a substrate on the electrostatic member so that a peripheral edge of the substrate contacts the conformal contact surface of the barrier; and (c) compressing the cantilever arm of the barrier using the peripheral edge of the substrate, by applying a voltage to the electrostatic member to electrostatically press the substrate against the conformal contact surface of the barrier, to form a seal that extends between the substrate and the support to reduce exposure of the electrostatic member to the erosive environment.

34. The method of claim 33, wherein in step (c), a sufficient voltage is applied to the electrostatic member to electrostatically attract the substrate with a force/area that compresses the conformal contact surface of the cantilever arm of the barrier against the substrate to form a seal that prevents escape of coolant gas held below the substrate.

35. The method of claim 33, wherein in step (c), a sufficient voltage is applied to the electrostatic member to exert an electrostatic attractive force/area on the substrate of less than about 5 Torr.

36. A method of enhancing the erosion resistance of an electrostatic chuck in an erosive environment, the chuck comprising (i) a electrostatic member capable of electrostatically holding a substrate, the electrostatic member comprising coolant grooves for holding coolant at a pressure below the substrate, and (ii) a support for supporting the electrostatic member, the method comprising the steps of:

(a) positioning a barrier circumferentially about the electrostatic member, the barrier comprising (i) a base resting on the support, and (ii) a cantilever arm extending from the base, the cantilever arm having a conformal contact surface capable of forming a seal against the substrate;

(b) placing a substrate on the electrostatic member so that a peripheral edge of the substrate contacts the conformal contact surface of the barrier; and (c) compressing the cantilever arm of the barrier using the peripheral edge of the substrate, by applying a voltage to the electrostatic member to electrostatically press the substrate against the conformal contact surface of the barrier to form a seal that extends between the substrate and the support, the seal provided to (i) reduce exposure of the electrostatic member to the erosive environment, and (ii) reduce leakage of coolant from the coolant grooves below the substrate.

* * * * *

UNITED STATES PATENT AND TRADEMARK OFFICE
CERTIFICATE OF CORRECTION

PATENT NO. : 5,636,098
DATED : June 3, 1997
INVENTOR(S) : Salfelder, et al.

It is certified that error appears in the above-identified patent and that said Letters Patent is hereby corrected as shown below:

On the title page, item [73] should read:

[73]   Assignee:   Applied Materials, Inc.
                   Santa Clara, California International Business Machines Corporation
                   Armonk, New York Signed and Sealed this Nineteenth Day of January, 1999

Attest:

*Attesting Officer*

*Acting Commissioner of Patents and Trademarks*